United States Patent [19]
Hshieh et al.

[11] Patent Number: 5,629,543
[45] Date of Patent: May 13, 1997

[54] TRENCHED DMOS TRANSISTOR WITH BURIED LAYER FOR REDUCED ON-RESISTANCE AND RUGGEDNESS

[75] Inventors: Fwu-Iuan Hshieh, Saratoga; Mike F. Chang; Lih-Ying Ching, both of Cupertino; Sze H. Ng, Sunnyvale; William Cook, Fremont, all of Calif.

[73] Assignee: Siliconix incorporated, Santa Clara, Calif.

[21] Appl. No.: 537,157

[22] Filed: Aug. 21, 1995

[51] Int. Cl.$^6$ .................................................. H01L 29/10
[52] U.S. Cl. ............................................ 257/330; 257/334
[58] Field of Search ................................. 257/329, 330, 257/331, 332, 334, 335, 336, 337

[56] References Cited

U.S. PATENT DOCUMENTS

| | | | |
|---|---|---|---|
| 5,034,785 | 7/1991 | Blanchard | 257/330 |
| 5,298,442 | 3/1994 | Bulucea et al. | 257/330 |
| 5,341,011 | 8/1994 | Hshieh et al. | 257/330 |
| 5,410,170 | 4/1995 | Bulucea et al. | 257/330 |
| 5,473,176 | 12/1995 | Kakumoto | 257/330 |

FOREIGN PATENT DOCUMENTS 0580452  1/1994  European Pat. Off. ............... 257/330

*Primary Examiner*—Sara W. Crane
*Assistant Examiner*—David B. Hardy

[57] ABSTRACT

A trench DMOS transistor includes a buried layer region formed between the drain region and overlying drift region and having a doping type the same as that of the drift region and drain region. The buried layer region is more highly doped than the drain region or drift regions and is formed by e.g. implantation prior to epitaxial growth of the overlying drift region. By providing an optimized doping profile for the buried layer region, it is ensured that avalanche breakdown occurs at the buried layer region/body region. Thus drain-source on resistance is reduced because the JFET region present in prior art devices is eliminated, while device ruggedness and reliability are enhanced.

12 Claims, 4 Drawing Sheets

TRENCHED DMOS TRANSISTOR WITH BURIED LAYER FOR REDUCED ON-RESISTANCE AND RUGGEDNESS

BACKGROUND OF THE INVENTION

1. Field of the Invention

This invention relates to transistors, and more specifically to a trenched DMOS transistor especially suitable for power transistor applications.

2. Description of Prior Art

DMOS transistors are well known. Some DMOS transistors as shown in FIG. 1 are trenched transistors, i.e. the transistor's conductive gate electrode 2 is formed in a trench in a substrate including a drain region 4A and drift region 4B, and the trench walls are insulated with silicon oxide, achieving higher density than that of planar type device. It is well known that trenched DMOS transistors are superior to planar DMOS transistors in terms of having less drain-source on resistance ($R_{DSON}$). Cell density is enhanced by reducing the length of the polysilicon gate electrodes 2 by placing them in the trench. The JFET (junction field effect transistor) resistance inherent in a planar DMOS transistor structure is significantly reduced by the gate electrode 2 being formed in the trench. Drain-source on resistance is the resistance between the drain region 4A and the source region 6 when the device is on (conductive) and is undesirable in a transistor.

However it is also known that when cell density is high as in the typical trenched transistor structure, a new undesirable JFET phenomenon gradually appears between the P+ deep body regions 5. The P+ deep body regions 5 typically extend from a principal surface of the semiconductor material into the P body region 7 to provide a contact to the P body region 7. These deep body regions 5 ensure that avalanche breakdown occurs in these regions rather than at the bottom of the trenches. This undesirable JFET phenomenon is because such deep body regions 5 are relatively close to each other. (Also shown in FIG. 1 are conventional drain electrode 8B and source-body electrode 8A.)

Thus while avalanche breakdown occurs rather than destructive breakdown at the trench bottom, i.e. breakdown damaging the insulating oxide at the trench bottom, undesirably this new JFET resistance makes a bigger contribution to drain-source on resistance when cell density is higher.

It would be desirable to reduce the drain-source on resistance of a trenched DMOS transistor at the same time as achieving a high cell density, in order to minimize transistor chip surface area.

SUMMARY

In accordance with the invention, a trenched DMOS transistor includes conventionally a drain region, a drift region overlying the drain region and doped to the same conductivity type but of a lower doping concentration, a body region overlying the drift region and having an opposite doping type, and a source region formed in the upper portion of the body region. A conductive gate electrode formed in an insulated trench extends from a principal surface of the body region through the body region into the drift region. Conventional metalization contacts the principal surface of the body region and the source regions, and also a contact is formed to the drain region.

Further, in accordance with the invention a doped buried layer is formed in the upper portion of the drain region and in contact with the drift region. This buried layer has the same doping type as that of the drain region and a doping concentration higher than that of the drift region, and is typically located to directly underlie the body contact (deep body) region formed between each pair of adjacent source regions. The buried layer is heavily doped to form N+ doped fingers extending into the drift region. This buried layer is typically formed prior to the epitaxial growth of the drift region, and by having an optimized doping profile ensures that avalanche breakdown occurs at the buried layer/body region or buried layer/body contact region. Hence the distance between the lower part of the body contact or body region and the upper part of the buried layer determines breakdown.

Thus drain-source on resistance is reduced because the JFET region present in the prior art device is eliminated, while at the same time device ruggedness and reliability are enhanced because avalanche breakdown occurs at the buried layer/body contact region. Typically for an N-channel DMOS device the buried layer is N type, as are the drift region, drain region and source regions. In one embodiment the N+ doped buried layer has a doping concentration greater, e.g. 3 to 10 times, that of the underlying drain region, and also about 10 times or more than that of the drift region.

DETAILED DESCRIPTION

Figure 2:
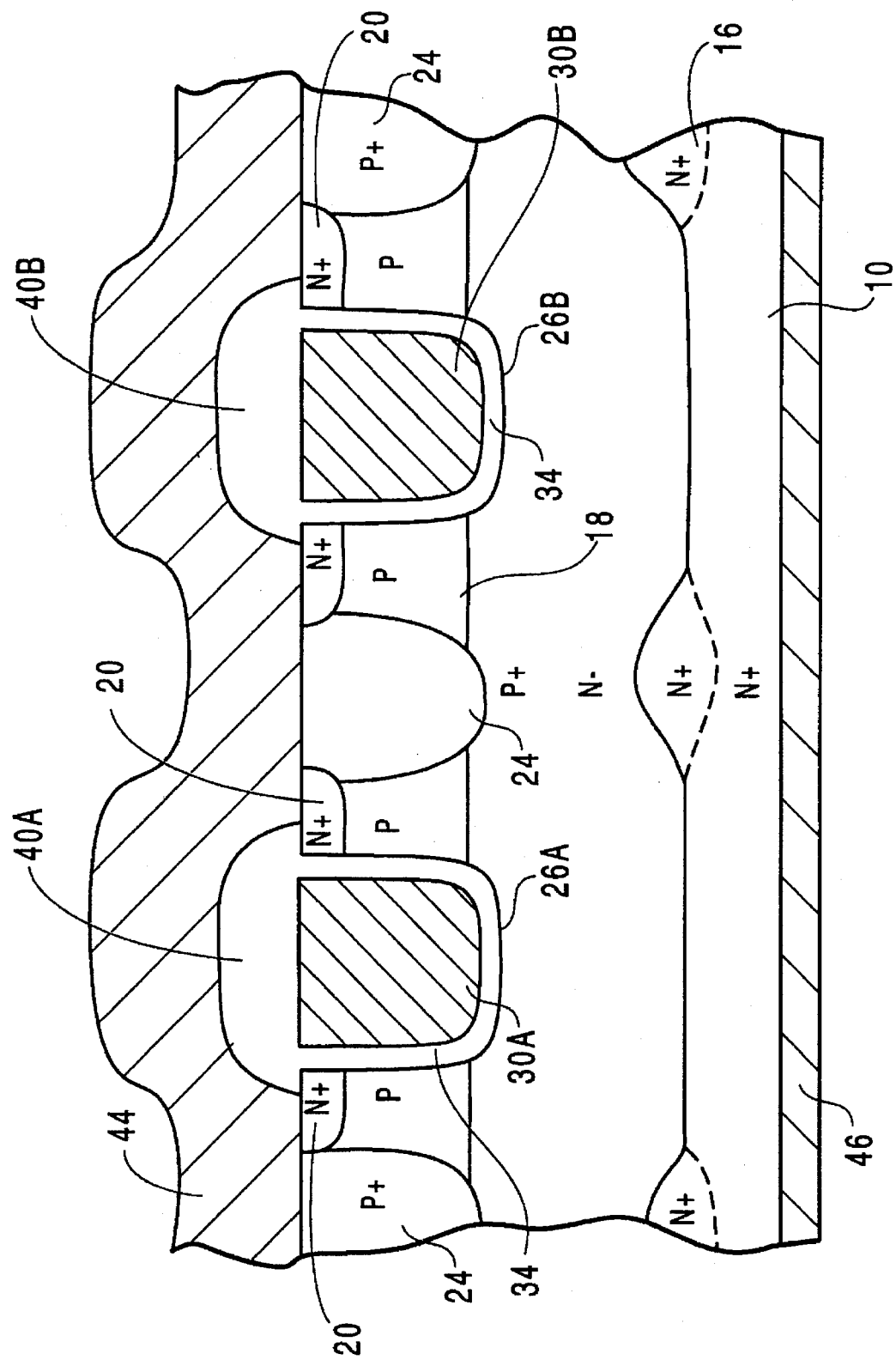
FIG. 2 shows in cross section a DMOS transistor in accordance with the present invention.

FIG. 2 shows a trenched DMOS transistor structure in accordance with the present invention. The substrate (drain) region 10 is in the lower portion of the semiconductor body and is N+ doped (in this N-channel embodiment) to have a resistivity in the range of 1 milliohm to 5 milliohms, i.e. $1.5 \times 10^{19}$ to $7.5 \times 10^{19}/cm^3$. A typical thickness of drain region 10 is 400 µm. Overlying drain region 10 is an N-doped drift region 14 doped to a level of $3 \times 10^{19}$ to $3 \times 10^{16}/cm^3$.

Formed between the drift region 10 and the drain region 14 are buried layer regions 16 which are N+ (or N++) doped. Each buried layer region has a doping level exceeding that of the drift region 14 and in one embodiment approximately 3 to 10 times the doping level of the drain region 10. Typically the buried layer regions 16 are arsenic or phosphorous or POCl$_3$ doped.

Each buried layer region 16 is e.g. 1 to 2 µm wide (depending on the process technology) and has a height in a range of e.g. 0.5 to 2.0 µm. (It is to be understood that the various dimensions and parameters given herein are illustrative and not limiting.) As can be seen, the buried layer regions 16 are located in the lower portion of the drift region 14 and in the upper portion of the drain region 10.

Overlying drift region 14 is a P doped body region 18 having a thickness of e.g. 12 µm and a doping concentration of e.g. $5 \times 10^{16}/cm^3$. Formed in body region 18 are conventional N+ source regions 20 having a doping level of e.g. $5 \times 10^{19}/cm^3$ and a depth of e.g. 0.5 µm and a width of e.g. 2 µm. Also formed in the P doped body region 18 are P+ doped body contact regions 24 having a doping level of e.g. $10^{19}/cm^3$ and a depth of e.g. 1.0 µm. These P+ doped regions 24 provide electrical contact to the underlying P body region 18 for the overlying metalization layer 44. It is to be understood that while P+ body contact regions 24 are depicted as deep body regions extending into drift region 14, regions 24 may be shallower, in which case the breakdown current conduction path is from body region 18 to buried layer 16.

Extending from the principal surface of the semiconductor body through the P body region 18 and into the drift region 14 are conventional trenches 30A, 30B, each of which is lined with a layer of gate oxide 34 and filled with doped polycrystalline silicon 30A, 30B. Structures 30A, 30B thus are the conventional gate electrodes.

Each gate electrode 30A, 30B is conventionally insulated on its topside by an overlying BPSG (borophosphosilicate glass) layer 40A, 40B which insulates the gate electrodes 30A, 30B from the overlying metalization It is to be understood that FIG. 2 is a cross-section of only a portion of a power transistor die. In a typical power transistor application there are thousands of individual cells, only approximately two of which are shown in FIG. 2. Moreover FIG. 2 is not drawn to scale and depicts delineations between the various doped regions which are illustrative rather than realistic depictions.

The top side geometry (not illustrated) of the structure of FIG. 2 is conventional, including for instance closed cells of various shapes i.e. square, rectangular, hexagonal etc., or linear (open) cells as defined by the trenches holding the gate electrodes.

Figure 1:
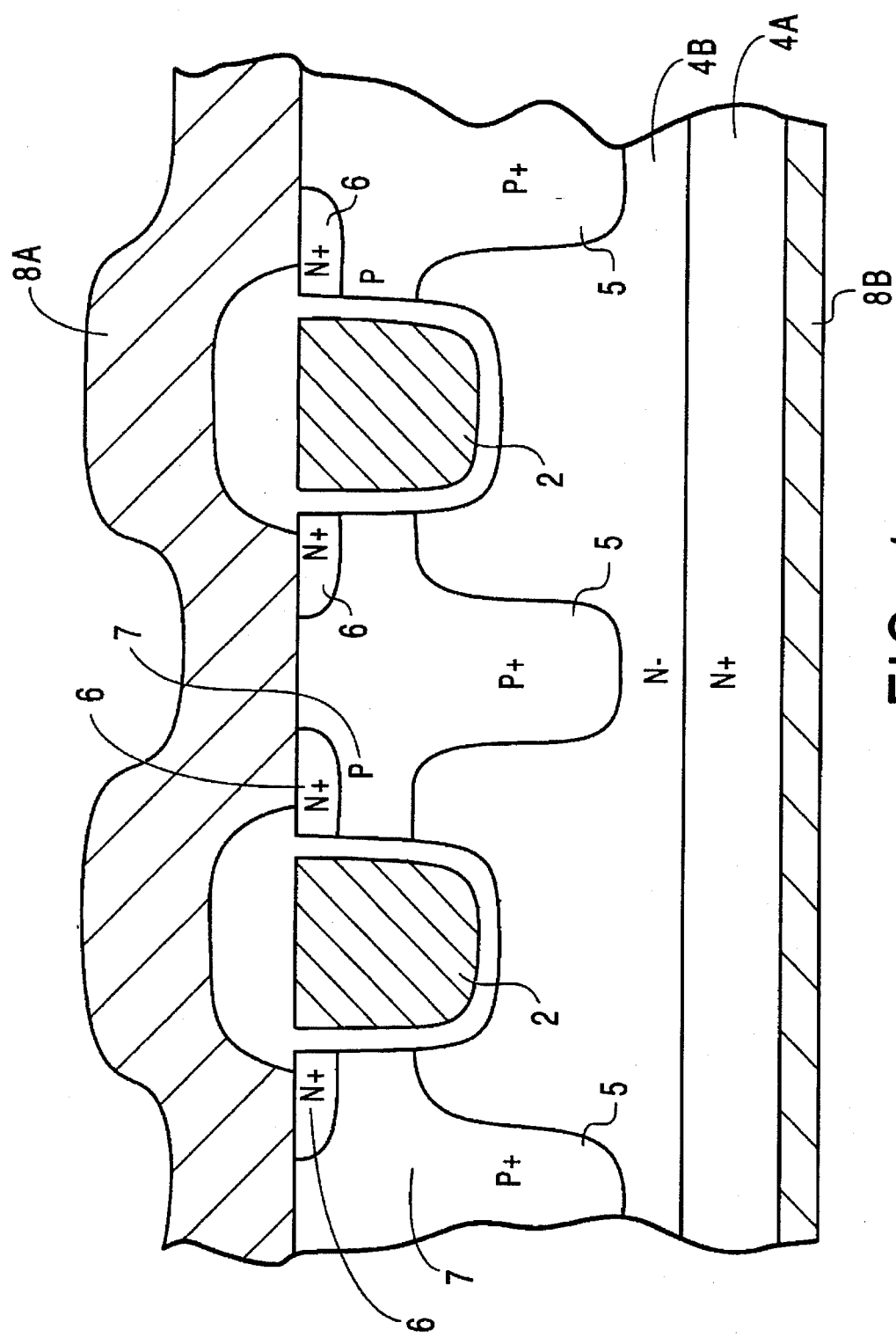
FIG. 1 shows in cross section a prior art DMOS transistor.

The width of each N+ buried layer 16 is dependent upon processing technology; a narrow width has been found to be more advantageous. This narrowness is achieved by minimizing lateral diffusion when the N+ buried layers 16 are formed, as described below. The goal is as narrow a buried layer region as possible. As can be seen in FIG. 1, the N+ buried layers 16 are located immediately below respective P+ doped body contact regions 24, and hence are located halfway between each pair of adjacent trenches 26A, 26B.

Thus in one embodiment as shown in FIG. 2, the identical mask (not a masking step or layer but the reticle or mask itself) is used to define both the P+ body contact regions 24 and the N+ buried layer regions 16, thus economizing on reticle fabrication. However there is no requirement to use the same reticle for both of these structures.

It has been found that a transistor structure as shown in FIG. 2 overcomes the problem of higher than desired resistance caused by JFETs due to high cell density.

In the structure of FIG. 2, a typical distance from the lowest portion of the body contact region 24 to the upper portion of each N+ buried layer region 16 is 0.5 μm. This is the location at which avalanche breakdown occurs, thereby advantageously reducing drain-source on resistance by eliminating the JFET region otherwise present. (The JFET region lies horizontally between any two adjacent P+ body contact regions, and vertically between the trench bottom and the bottom of the P+ body contact region.)

FIGS. 3A through 3F show process steps for forming the structure of FIG. 2.

Figure 3A:
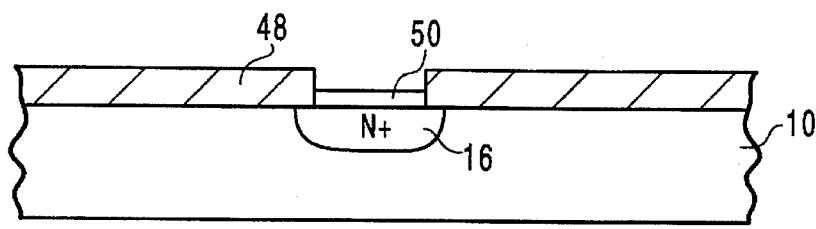
FIGS. 3A–3F show process steps to form the transistor of FIG. 2.
Figure 3B:
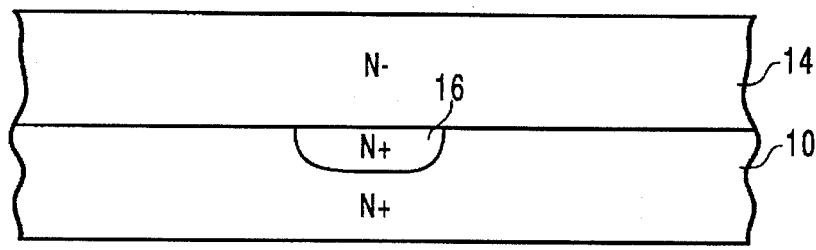

Beginning as shown in FIG. 3A, an N+ doped substrate 10 (typically silicon) is provided. Typically this is a conventional semiconductor wafer, and it is to be appreciated that FIGS. 3A through 3F show only a portion of a cross section of such a wafer. Only portions of two cells are illustrated. As described above, typically there are many such cells present on one power transistor and there are many power transistors on one wafer.

As shown in FIG. 2A, an oxide layer 48 e.g. 6,500 Å thick is grown over the entire principal surface of substrate 10. Then using a mask, oxide layer 48 is patterned to expose a portion of the principal surface of the substrate 10. Then an ion implant is performed using arsenic or phosphorus or $POCl_3$ to form N+ (or N++) buried layer region 16. It is appreciated that a number of such buried layer regions are formed spaced apart. A thin oxide layer 50 is grown over the implanted area during the drive-in (diffusion) of N+ buried layer region 16.

Then oxide layer 48 and thin oxide layer 50 are stripped and an epitaxial region 14 which is N− doped is grown to a thickness of approximately 7.0 μm. This in effect "buries" region 16.

An active region mask (not shown as being outside the plane of the drawing) is then formed over the principal surface of epitaxial layer 14 to define the active portion of the device versus the termination portion. The termination portion (not shown here) is conventional.

Figure 3C:
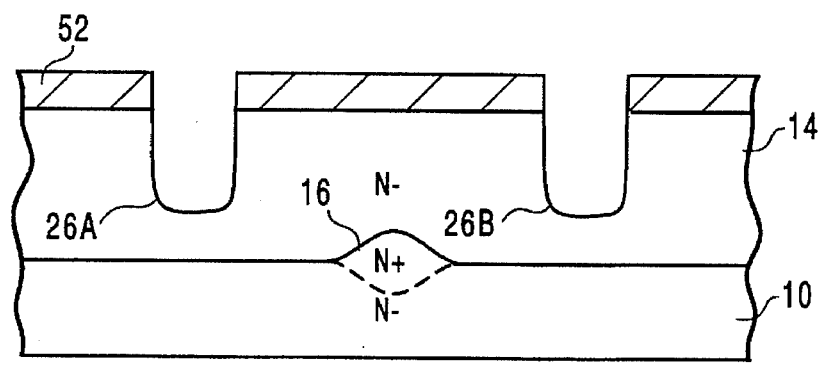

As shown in FIG. 3C a trench mask layer 52 is then formed over the principal surface of epitaxial layer 14 and patterned using a mask. Then trenches 26A and 26B are anisotropically etched to a depth of approximately 1.7 μm. This etching typically involves a sacrificial oxide step (of the type known in the art) to achieve smooth interior wall surfaces of trenches 26A and 26B.

Figure 3D:
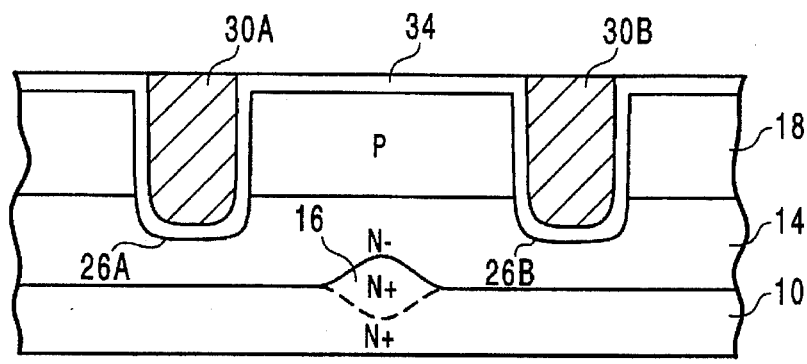

Then as shown in FIG. 3D, a gate oxide layer 34 is grown over the interior surfaces of trenches 26A and 26B and over the principal surface of epitaxial layer 14 (trench mask layer 52 having already been stripped off). This gate oxide layer 34 has a typical thickness of 500 Å.

Then also in FIG. 3D, polycrystalline silicon (polysilicon) is deposited in the trenches 26A, 26B and over the principal surface of epitaxial layer 14. This polycrystalline silicon is then conventionally doped and patterned to define conductive gate electrodes 30A and 30B located respectively in trenches 26A and 26B.

Then a P-type ion implant is performed to form the P body region 18 having a final doping concentration of e.g. $5 \times 10^{16}/cm^3$. The depth of body region 18 is e.g. 1.2 μm. This is a maskless (blanket) implantation.

Figure 3E:
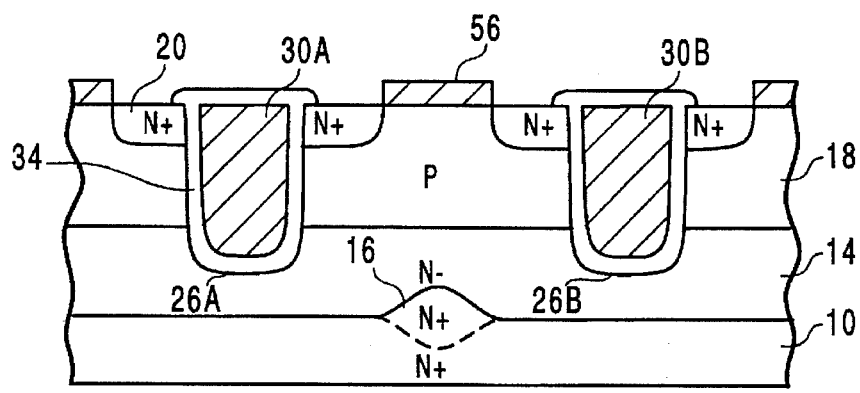

Then as shown in FIG. 3E, another masking layer 56 is formed and patterned over the principal surface of what is now P body region 18. This is the source region masking layer.

Source masking layer 56 is then used to define source regions 20 which are N+ ion implanted to a typical final doping concentration in the range of $1 \times 10^{19}/cm^3$ to $10^{20}/cm^3$. Typical depth of the N+ source regions 20 is 0.5 μm. A typical width of the trenches 26A and 26B is 1 to 2 μm. This source masking layer is then stripped.

Then using the same mask (reticle) as was earlier used to define the buried layer region 16, a deep body contact masking layer (not shown) is formed and patterned to define deep body contact regions 24, which are then P+ ion implanted. The body contact mask layer is then stripped.

Figure 3F:
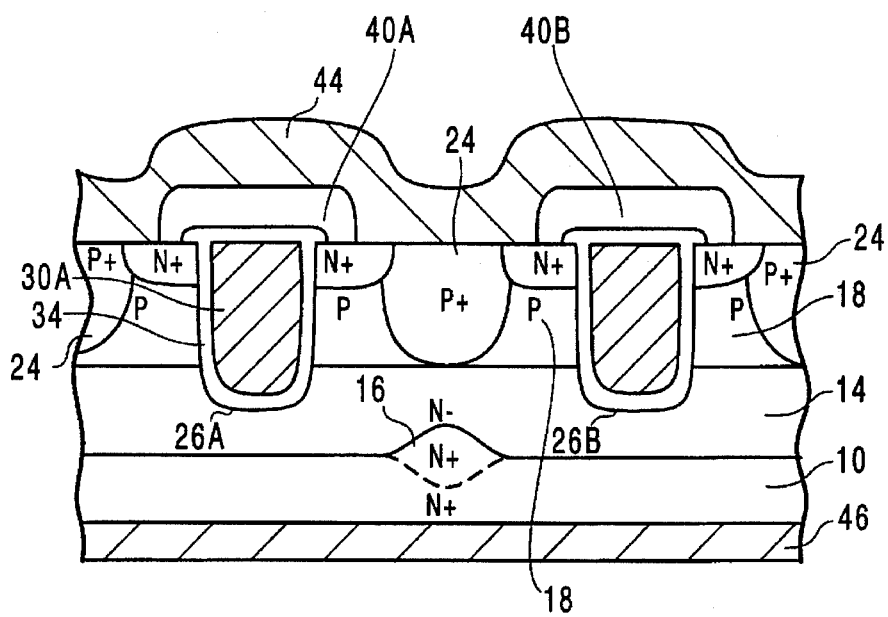

The transistor structure is conventionally completed in FIG. 3F by forming a BPSG layer over the principal surface and patterning the BPSG layer with a mask (not shown) to define BPSG regions 40A and 40B, associated respectively with conductive gate electrodes 30A and 30B. Then a conventional drain contact layer 46 is formed on the drain region 10, i.e. on the backside of the substrate. A pad mask step (not shown) is also used to define pad contacts.

While the description herein is of an N-channel device, a complementary P-channel device having all doping types of the opposite type is also achievable in accordance with the invention.

The above description is illustrative and not limiting; further modifications will be apparent to one of ordinary skill in the art and are intended to fall within the scope of the appended claims.

We claim:

1. A transistor comprising:

a substrate region doped a first conductivity type;

a drift region overlying the substrate region and doped the first conductivity type to a lower concentration than the substrate;

a body region overlying the drift region and doped a second conductivity type;

a conductive gate electrode extending from a principal surface of the body region through the body region;

a source region doped the first conductivity type and formed in the body region, and extending to the principal surface thereof; and a buried layer region doped the first conductivity type to a concentration greater than that of the substrate region, and extending at least in part into the drift region and adjacent the substrate region.

2. The transistor of claim 1, further comprising a body contact region doped the second conductivity type and to a higher concentration than the body region, and formed in the body region and extending to the principal surface thereof.

3. The transistor of claim 2, wherein the buried layer region extends to within 0.5 μm of the body contact region.

4. The transistor of claim 1, wherein a doping concentration of the buried layer region is greater than $10^{18}/cm^3$.

5. The transistor of claim 1, wherein a doping concentration of the buried layer region is at least 5 times that of the drift region.

6. The transistor of claim 1, wherein a width of the buried layer region is in a range of 1 to 2 μm.

7. The transistor of claim 1, wherein a thickness of the buried layer region is in a range of 0.5 to 2 μm.

8. The transistor of claim 1, wherein the doping concentration of the buried layer region is at least three times a doping concentration of the substrate region.

9. The transistor of claim 1, wherein the buried layer region extends closer to the body region than does the substrate region.

10. The transistor of claim 1, wherein the buried layer region extends at least 0.5 μm closer to the body region than does the substrate region.

11. A transistor comprising:

a substrate region doped a first conductivity type;

a drift region overlying the substrate region and doped the first conductivity type to a lower concentration than the substrate;

a body region overlying the drift region and doped a second conductivity type;

a conductive gate electrode extending from a principal surface of the body region through the body region;

a source region doped the first conductivity type and formed in the body region, and extending to the principal surface thereof; and a buried layer region doped the first conductivity type tea concentration greater than that of the drift region, and extending at least in part into the drift region and adjacent the substrate region, wherein the buried layer region extends to within 0.5 μm of the body region.

12. A transistor comprising:

a substrate region doped a first conductivity type;

a drift region overlying the substrate region and doped the first conductivity type to a lower concentration than the substrate;

a body region overlying the drift region and doped a second conductivity type;

a conductive gate electrode extending from a principal surface of the body region through the body region;

a source region doped the first conductivity type and formed in the body region, and extending to the principal surface thereof; and a buried layer region doped the first conductivity type to a concentration greater than that of the drift region, and extending at least in part into the drift region and adjacent the substrate region, wherein a width of the buried layer region is in a range of 1 to 2 μm.

* * * * *